(12) United States Patent
Koga et al.

(10) Patent No.: US 6,740,929 B2
(45) Date of Patent: May 25, 2004

(54) SEMICONDUCTOR DEVICE AND METHOD FOR TESTING SEMICONDUCTOR DEVICE (75) Inventors: Makoto Koga, Kawasaki (JP); Kunihiko Gotoh, Kawasaki (JP); Kenichi Matsumaru, Kawasaki (JP); Mitsuya Kawata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/320,420

(22) Filed: Dec. 17, 2002

(65) Prior Publication Data

US 2003/0067016 A1 Apr. 10, 2003

Related U.S. Application Data (62) Division of application No. 09/626,107, filed on Jul. 26, 2000.

(30) Foreign Application Priority Data

Jul. 26, 1999 (JP) .......................................... 11-210803

(51) Int. Cl.$^7$ ............................................... H01L 29/00
(52) U.S. Cl. ......................... 257/321; 257/48; 257/390
(58) Field of Search ............................... 257/321, 324, 257/411, 316, 635, 636, 637, 649, 28, 325, 410, 390, 740; 390/48; 711/167, 5, 500; 365/230.03, 233

(56) References Cited

U.S. PATENT DOCUMENTS

| | | | |
|---|---|---|---|
| 4,698,588 A | 10/1987 | Hwang et al. | |
| 4,710,933 A | 12/1987 | Powell et al. | |
| 4,994,732 A | 2/1991 | Jeffrey et al. | |
| 5,175,836 A * | 12/1992 | Morgan ...................... | 711/172 |
| 5,225,775 A | 7/1993 | Sekino | |
| 5,243,703 A * | 9/1993 | Farmwald et al. .......... | 713/400 |
| 5,254,942 A | 10/1993 | D'Souza et al. | |
| 5,311,486 A | 5/1994 | Alton et al. | |
| 5,321,277 A | 6/1994 | Sparks et al. | |
| 5,396,170 A | 3/1995 | D'Souza et al. | |
| 5,526,365 A * | 6/1996 | Whetsel ...................... | 714/726 |
| 5,677,915 A | 10/1997 | Whetsel | |
| 5,717,652 A | 2/1998 | Ooishi | |
| 5,952,692 A * | 9/1999 | Nakazato et al. ........... | 257/321 |
| 6,006,343 A | 12/1999 | Whetsel | |
| 6,094,389 A | 7/2000 | Ahn | |
| 6,122,190 A | 9/2000 | Ooishi | |
| 6,130,647 A | 10/2000 | Zurcher et al. | |
| 6,233,182 B1 | 5/2001 | Satou et al. | |
| 6,301,166 B1 | 10/2001 | Ooishi | |
| 6,385,127 B1 | 5/2002 | Ikeda | |
| 6,393,541 B1 * | 5/2002 | Fujii ........................... | 711/167 |
| 6,528,817 B1 * | 3/2003 | Koga et al. ................... | 257/48 |

FOREIGN PATENT DOCUMENTS

JP        11210803        2/2001

* cited by examiner

Primary Examiner—Carl Whitehead, Jr.
Assistant Examiner—Laura M Schillinger
(74) Attorney, Agent, or Firm—Staas & Halsey LLP

(57) ABSTRACT

A semiconductor device having at least three independently accessible memories, with at least one of the memories having a different memory capacity than the others. Separate selection signals are provided to the memories so that they can be independently activated. This allows the memories to be separately tested. When testing the semiconductor device, the memories are tested serially, except for the memory with the largest capacity, since this memory also has the longest test time. The memory with the longest test time is tested in parallel with the serially tested memories. This reduces the current that must be supplied by a test device to the semiconductor device during testing.

4 Claims, 8 Drawing Sheets

SEMICONDUCTOR DEVICE AND METHOD FOR TESTING SEMICONDUCTOR DEVICE

This is a divisional of U.S. application Ser. No. 09/626,107 filed on Jul. 26, 2000, now allowed.

BACKGROUND OF THE INVENTION

The present invention relates to a semiconductor device and a method for testing a semiconductor device, and more particularly, to a semiconductor device and a method for testing a semiconductor device formed by connecting at least three independently accessible macro semiconductor memory devices connected to a semiconductor substrate.

A semiconductor device may be formed by connecting three or more independently accessible semiconductor memory devices, such as, dynamic random access memories (DRAMs), to a single semiconductor substrate. Each of the memory devices is referred to as a macro since it can be accessed independently. Evaluation tests are normally conducted on each of the macros.

Figure 1:
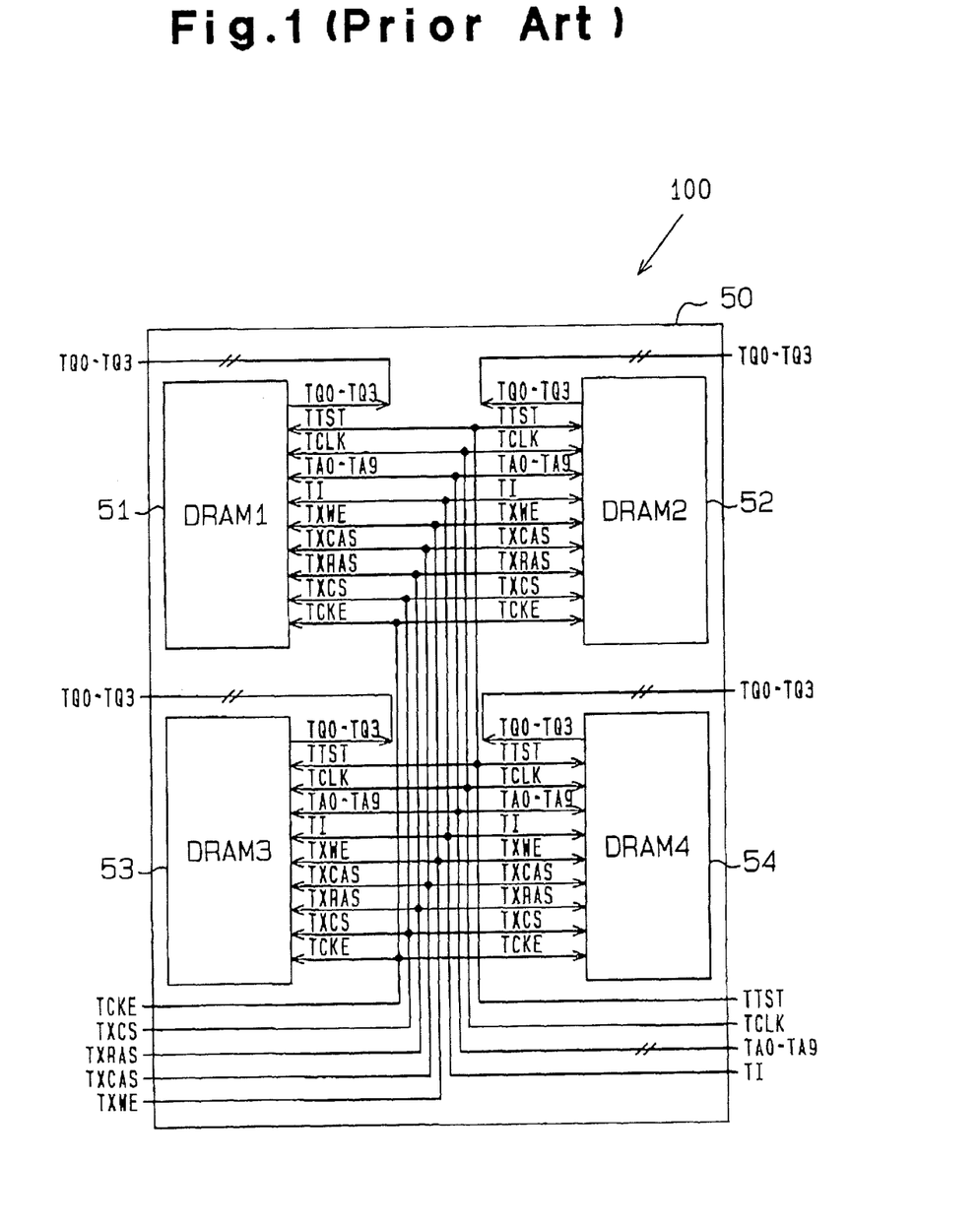
FIG. 1 is a schematic block diagram showing a prior art semiconductor device.

FIG. 1 is a schematic block diagram showing a prior art semiconductor device 100.

The semiconductor device 100 has four independently accessible DRAMs 51, 52, 53, 54 connected to a semiconductor substrate 50. The first to fourth DRAMs 51–54 are each controlled, for example, by the same external device or independently with different external devices. Each of the DRAMs 51–54 is thus provided with an I/O terminal (not shown) connected to the associated external device.

The DRAMS 5–54 are also each controlled by a tester. The tester sends test signals to the DRAMs 51–54 through a common input terminal and signal line. As shown in FIG. 1, the test signals include a test mode signal TTST, a test clock enable signal TCKE, a test clock signal TCLK, a test chip select signal TXCS, a test row address strobe signal TXRAS, a test column address strobe signal TXCAS, a test write enable signal TXWE, test address signals TA0–TA9, and test write data TI.

Output data (test data) TQ0-TQ3 of the respective first to fourth DRAMs 51–54 must each be separately provided to the tester. Thus the first to fourth DRAMs 51–54 each have an output terminal and a signal line for each of the output data TQ0-TQ3.

When the tester tests the DRAMs 51–54, the various test signals are provided to the first to fourth DRAMs 51–54 through the common input terminal and signal line. The tester simultaneously commences testing of each of the DRAMs 51–54.

A memory capacity difference between the DRAMs 51–54 results in the shortcomings discussed below.

In one example, the first and second DRAMs 51, 52 each have a memory capacity of one megabit, the third DRAM 53 has a memory capacity of two megabits, and the fourth DRAM 54 has a memory capacity of four megabits. That is, the first and second DRAMs 51, 52 each have a DRAM core with an array block of one megabit, the third DRAM 53 has a DRAM core of two array blocks, and the fourth DRAM 54 has a DRAM core of four array blocks.

When the tester simultaneously commences testing of the DRAMs 51–54, the testing is completed first by the DRAMs having small memory capacities. That is, the testing of the one megabit first and second DRAMs 51, 52 are completed first, and the testing of the remaining two megabit third DRAM 53 and the four megabit fourth DRAM 54 is continued. Then, the testing of the third DRAM 53 is completed, and the testing of the fourth DRAM 54 is continued. Subsequently, the testing of the fourth DRAM 54 is completed.

Figure 2:
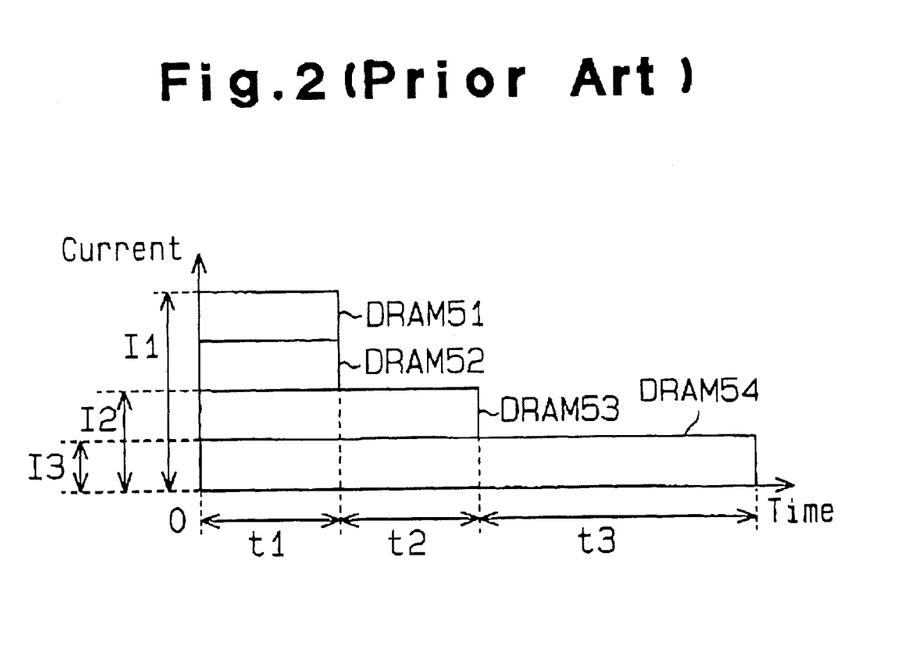
FIG. 2 is a graph showing the relationship between the testing order of the DRAMs and the consumption current in the prior art.

Referring to FIG. 2, the semiconductor 100 is supplied with consumption current I1 during a first period t1 from when the testing is commenced to when the testing of the first and second DRAMs 51, 52 is completed. Then, the semiconductor 10 is supplied with consumption current I2 during a second period t2 from when the testing of the first and second DRAMs 51, 52 is completed to when the testing of the third DRAM 53 is completed. Afterward, the semiconductor 100 is supplied with consumption current I3 during a third period from when the testing of the third DRAM 53 is completed to when the testing of the fourth DRAM 54 is completed.

During the first test period t1 when the four DRAMs 51–54 are tested simultaneously, the power consumption of the semiconductor device 100 is maximum. The tester simultaneously tests a multiple number of the semiconductor devices. Thus, if the consumption current I1 is large, the tester must have a large current supplying capability. However, the current supplying capability can only be increased to a certain level. This limits the number of semiconductor devices that can be simultaneously tested. As a result, the testing cost and testing time are high.

SUMMARY OF THE INVENTION

It is an object of the present invention to provide a semiconductor device and a method for testing the semiconductor device that increases the number of semiconductor devices that can be simultaneously tested without increasing the current supplying capability of the tester.

To achieve the above object, the present invention provides a method for testing a semiconductor device including at least three memory devices. The memory devices are each independently accessible, and at least one memory device has a memory capacity differing from the other memory devices. The method includes the steps of serially testing at least two of the memory devices excluding the memory device having a test period that is longest among the memory devices, and testing the memory device having the longest test period in parallel with the memory devices being serially tested.

A further aspect of the present invention provides a semiconductor device including at least three independently accessible memory devices that can be independently tested. At least one of the memory devices has a memory capacity differing from the other memory devices. Selection signal lines independently provide each of the memory devices with a selection signal that activates the memory device.

Another aspect of the present invention provides a semiconductor device including at least three independently accessible memory devices that can be independently tested. At least one of the memory devices has a memory capacity differing from the other memory devices. A plurality of signal lines provide each of the memory devices with an address signal and a selection signal, for activating the memory devices. An inverter circuit is connected between a predetermined one of the memory devices and a predetermined one of the signal lines for providing the selection signal. The inverter circuit inverts the selection signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 3:
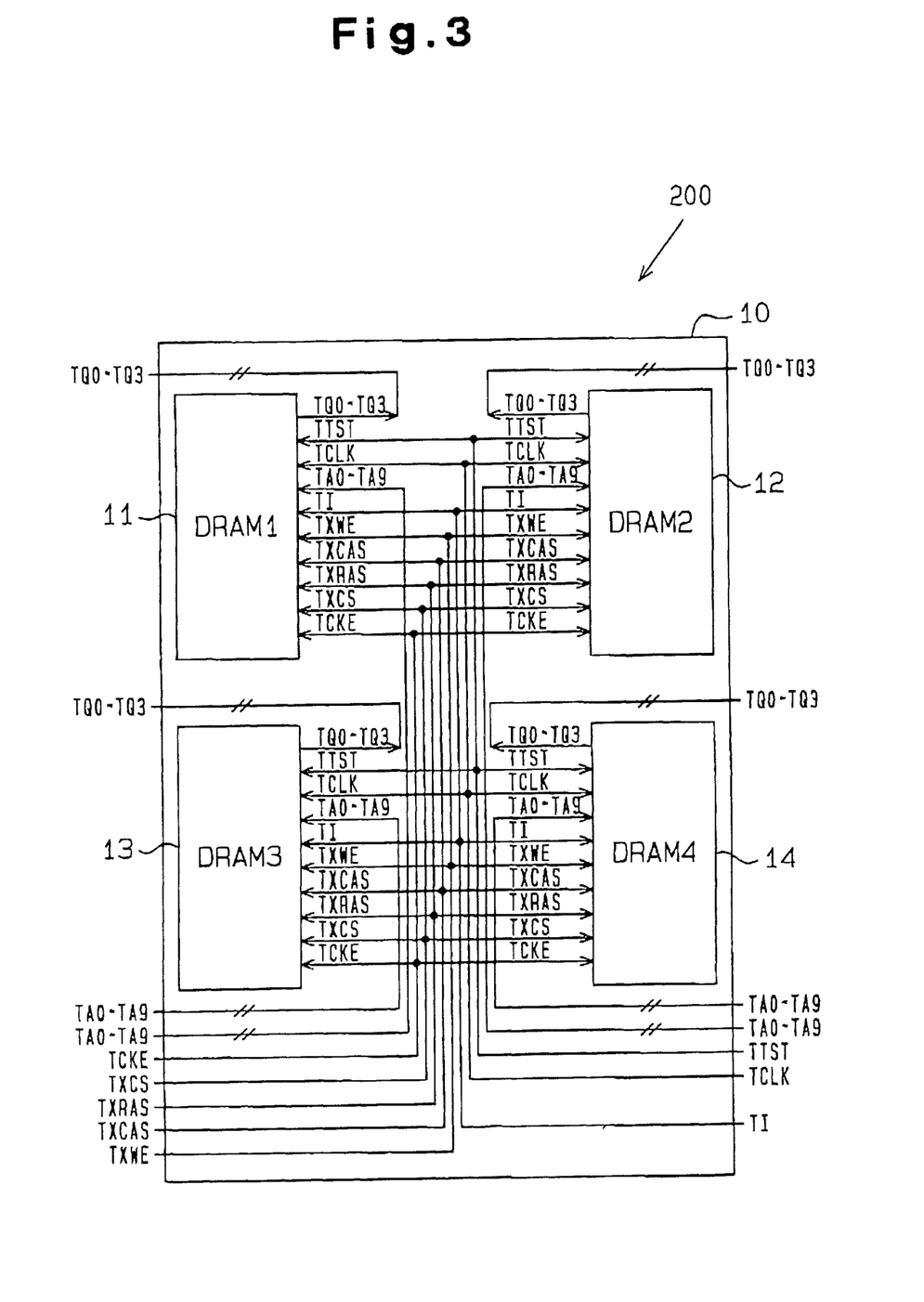
FIG. 3 is a schematic block diagram showing a semiconductor device according to a first embodiment of the present invention.

FIG. 3 is a schematic block diagram showing a semiconductor device 200 according to a first embodiment of the present invention.

The semiconductor device 200 has a substrate 10 to which four semiconductor memory devices, or DRAMs 11, 12, 13, 11 and a logic circuit device (not shown) are connected.

Figure 4:
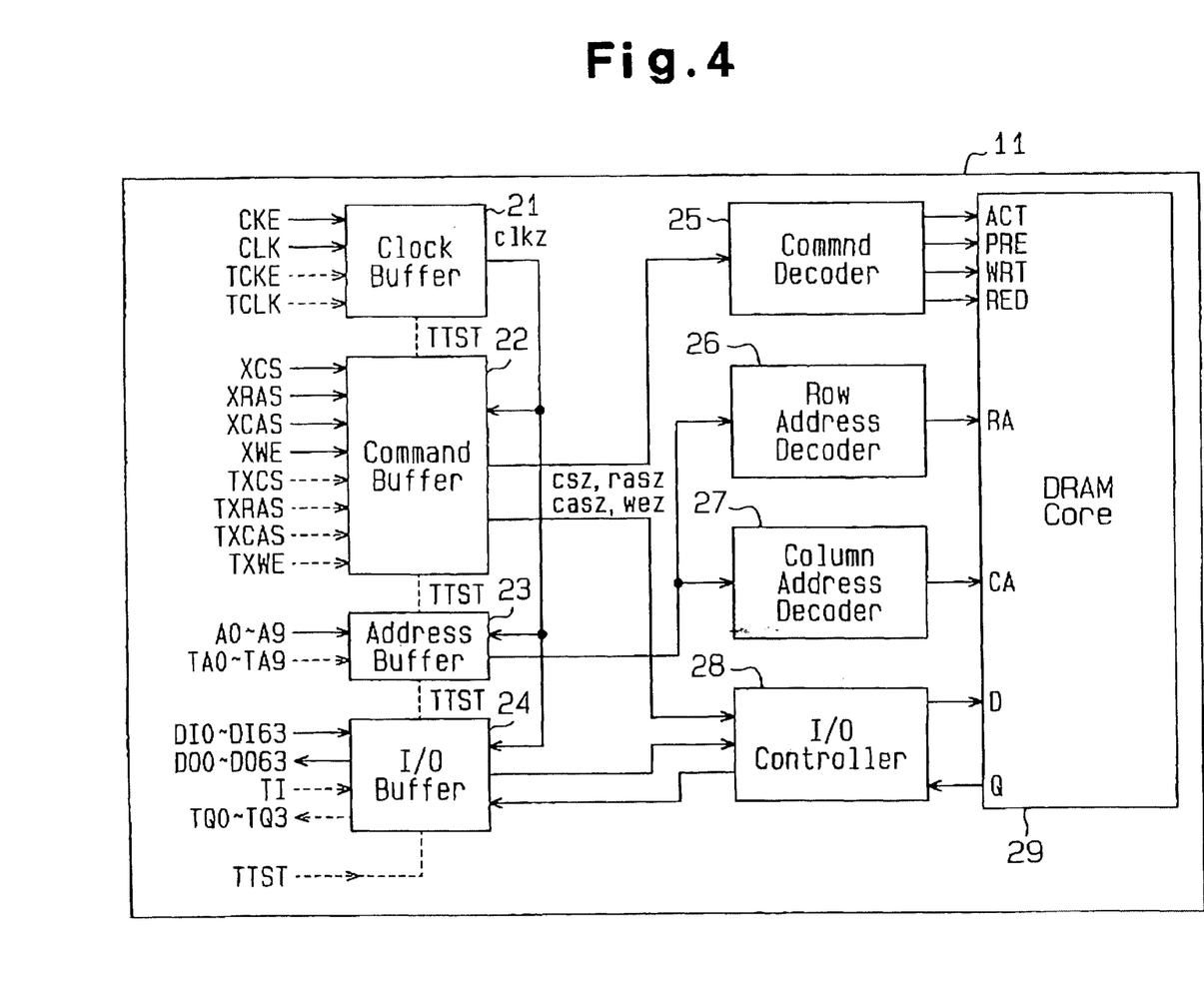
FIG. 4 is a schematic block diagram showing a DRAM of the semiconductor device of FIG. 3.

Referring to FIG. 4, each of the DRAMs 11–14 includes a clock buffer 21, a command buffer 22, an address buffer 23, an I/O buffer 24, command decoder 25, a row address decoder 26, a column address decoder 27, an I/O controller 28, and a DRAM core 29.

Figure 5:
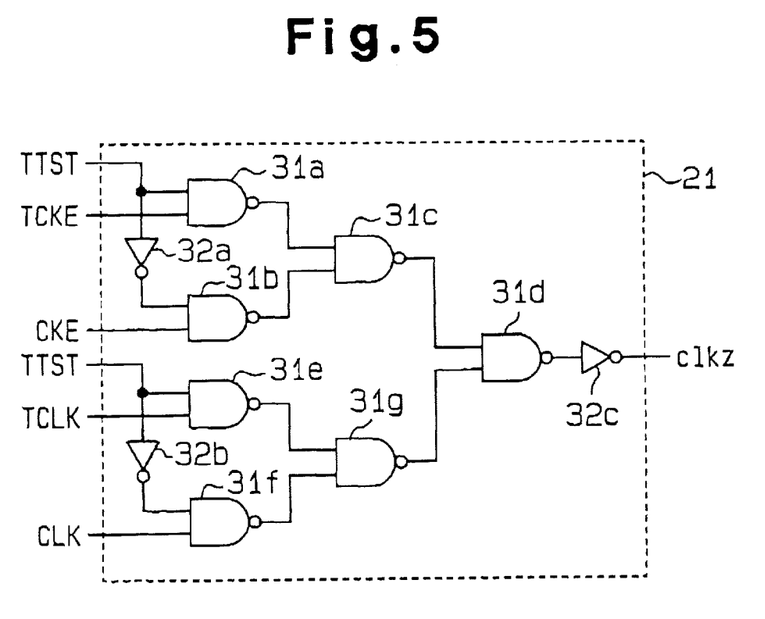
FIG. 5 is a schematic circuit diagram showing a clock buffer of the DRAM of FIG. 4.

The clock buffer 21 receives a clock enable signal CKE and a clock signal CLK from an external device or a test clock enable signal TCKE and a test clock signal TCLK from a tester. Then, the clock buffer 21 generates an internal clock signal clkz in response to the signals CKE, CLK or the signals TCKE, TCLK and provides the signal clkz to the command buffer 22, the address buffer 23, and the I/O buffer 24. FIG. 5 is a schematic circuit diagram showing the clock buffer 21.

Referring to FIG. 5, the clock buffer 21 includes seven 2-input NAND circuits 31a, 31b, 31c, 31d, 31e, 31f, 31g and three inverter circuits 32a, 32b, 32c.

The NAND circuit 31a has a first input terminal provided with a test mode signal TTST and a second input terminal provided with the test clock enable signal TCKE. The NAND circuit 31b has a first input terminal provided with the test mode signal TTST via the inverter circuit 32a and a second input terminal provided with the clock enable signal CKE. The output terminal of the NAND circuit 31a is connected to a first input terminal of the NAND circuit 31c, and the output terminal of the NAND circuit 31b is connected to a second input terminal of the NAND circuit 31c. The output terminal of the NAND circuit 31c is connected to a first input terminal of the NAND circuit 31d.

The NAND circuit 31e has a first input terminal provided with the test mode signal TTST and a second input terminal provided with the test clock signal TCLK. The NAND circuit 31f has a first input terminal provided with the test mode signal TTST via the inverter circuit 32b and a second input terminal provided with the clock signal CLK. The output terminal of the NAND circuit 31e is connected to a first input terminal of the NAND circuit 31g, and the output terminal of the NAND circuit 31f is connected to a second input terminal of the NAND circuit 31g. The output terminal of the NAND circuit 31g is connected to a second input terminal of the NAND circuit 31d. The output terminal of the NAND circuit 31d is connected to the input terminal of the inverter circuit 32c. The internal clock signal clkz is output from the output terminal of the inverter circuit 32c.

When the tester tests the DRAMs 11, 12, 13, 14, the test mode signal TTST output by the tester goes high. Thus, the test mode signal input to the first input terminal of the NAND circuit 31b via the inverter circuit 32a is low. In this state, the signal output by the NAND circuit 31b is high regardless of the level of the clock enable signal CKE. In the same manner, the signal provided to the input terminal of the NAND circuit 31f via the inverter circuit 32b is low, and the signal output by the NAND circuit 31f is high regardless of the level of the clock signal CLK.

In this state, the internal clock signal clkz is generated in accordance with the test clock enable signal TCKE and the test clock signal TCLK. In other words, when the test clock enable signal TCKE goes high, the NAND circuit 31a provides a low signal to the first input terminal of the NAND circuit 31c. Since the signal provided to the second input terminal of the NAND circuit 31c from the NAND circuit 31c is high, the NAND circuit 31c provides the first input terminal of the NAND circuit 31d with a high signal. In this state, when the test clock signal TCLK provided to the second input terminal of the NAND circuit 31e goes high, the NAND circuit 31e provides the first input terminal of the NAND circuit 31g with a low signal. Since the signal provided to the other input terminal of the NAND circuit 31g is high, the NAND circuit 31g provides the second input terminal of the NAND circuit 31d with a high signal. As a result, the NAND circuit 31d outputs a low signal and the internal clock signal clkz output by the inverter circuit 32c goes high.

When the test clock signal TCLK goes low, the signal provided from the NAND circuit 31e to the first input terminal of the NAND circuit 31g goes high. Thus, the signal provided from the NAND circuit 31g to the second terminal of the NAND circuit 31d goes low. As a result, the NAND circuit 31d outputs a high signal and the internal clock signal clkz output by the inverter circuit 32c goes low.

If the test clock enable signal TCKE goes low, the NAND circuit 31a outputs a high signal. In this case, the NAND circuit 31c receives high input signals at both of its input terminals and provides the first input terminal of the NAND circuit 31d with a low signal. Thus, the signal output by the NAND circuit 31d is high regardless of the level of the test clock signal TCLK. In this state, the internal clock signal clkz output by the inverter circuit 32c is always low.

During normal operation, the test mode signal TTST is low. Thus, the NAND circuit 31a outputs a high signal regardless of the level of the test clock enable signal TCKE, and the NAND circuit 31e outputs a high signal regardless of the level of the test clock signal TCLK.

In this state, the internal clock signal clkz is generated in accordance with the clock enable signal CKE and the clock signal CLK. In other words, when the clock enable signal CKE provided to the NAND circuit 31b is high, the internal clock signal clkz is output from the inverter circuit 32c in accordance with the clock signal CLK provided by the NAND circuit 31f. When the clock enable signal CKE provided to the NAND circuit 31b is low, the internal clock signal clkz output from the inverter circuit 32c is low regardless of the level of the clock signal CLK.

With reference to FIG. 4, during normal operation, the command buffer 22 receives a chip select signal XCS, a row address strobe signal XRAS, a column address strobe signal XCAS, and a write enable signal XWE from an external device in accordance with the internal clock signal clkz generated by the clock buffer 21, that is, in accordance with the clock signal CLK. The command buffer 22 then provides the command decoder 25 and the I/O controller 28 with signals csz, rasz, casz, wez that are associated with the signals XCS, XRAS, XCAS, XWE, respectively.

During testing, the command buffer 22 receives a test chip select signal TXCS, a test row address strobe signal TXRAS, a test column address strobe signal TXCAS, and a test write enable signal TXWE in accordance with the internal clock signal clkz generated by the clock buffer 21, that is, in accordance with the clock signal TCLK. The command buffer 22 then provides the command decoder 25 and the I/O controller 28 with signals csz, rasz, casz, wez that are associated with the signals TXCS, TXRAS, TXCAS, TXWE, respectively.

Figure 6:
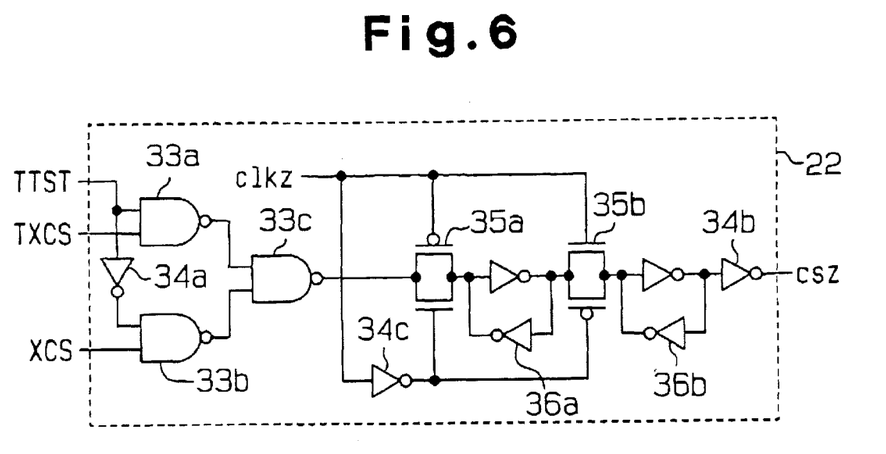
FIG. 6 is a schematic circuit diagram showing a command buffer of the DRAM of FIG. 4.

FIG. 6 is a schematic circuit diagram showing part of the command buffer 22.

The command buffer 22 has three NAND circuits 33a, 33b, 33c, three inverter circuits 34a, 34b, 34c, two transmission gates 35a, 35b, and two latch circuits 36a, 36b. Each of the transmission gates 35a, 35b has an NMOS transistor and a PMOS transistor. Each of the latch circuits 36a, 36b includes two inverter circuits. FIG. 6 shows a circuit which outputs the internal chip select signal csz corresponding to the chip select signal XCS and the Lest chip select signal TXCS.

The NAND circuit 33a has a first input terminal provided with the test mode signal TTST and a second input terminal provided with the chip select signal TXCS. The NAND circuit 33b has a first input terminal provided with the test mode signal TTST via the inverter circuit 34a and a second input terminal provided with the chip select signal XCS The output terminal of the NAND circuit 33a is connected to a first input terminal of the NAND circuit 33c, and the output terminal of the NAND circuit 33b is connected to a second input terminal of the NAND circuit 33c. The output terminal of the NAND circuit 33c is connected to the input terminal of the first transmission gate 35a, which output terminal is connected to the input terminal of the second transmission gate 35b via the latch circuit 36a. The output terminal of the transmission gate 35b is connected to the inverter circuit 34b via the latch circuit 36b.

The gate terminal of the PMOS transistor in the transmission gate 35a and the gate terminal of the NMOS transistor in the transmission gate 35b are provided with the internal clock signal clkz. The gate terminal of the NMOS transistor in the transmission gate 35a and the gate terminal of the PMOS transistor in the transmission gate 35b are provided with the internal clock signal clkz via the inverter circuit 34c.

When the internal clock signal clkz goes low, the transmission gate 35a is activated and the transmission gate 35b is deactivated. When the internal clock signal clkz goes high, the transmission gate 35a is deactivated and the transmission gate 35b is activated. In other words, the internal clock signal clkz controls the activation and deactivation of the transmission gates 35a, 35b and outputs the internal chip select signal csz associated with the chip select signal XCS or the test chip select signal TXCS from the inverter circuit 34b.

During testing, the test mode signal TTST is high, and the associated input terminal of the NAND circuit 33b is provided with a low signal via the inverter circuit 34a. Thus, the signal output by the NAND circuit 33b is high regardless of the level of the chip select signal XCS. Accordingly, the level of the output signal of the NAND circuit 33c changes in accordance with the test chip select signal TXCS. When the test chip select signal TXCS is high, the NAND circuit 33a outputs a low signal. When the test chip select signal TXCS goes low, the NAND circuit 33a outputs a high signal, and the NAND circuit 33c outputs a low signal.

During normal operation, the test mode signal TTST is low, and the NAND circuit 33a outputs a high signal regardless of the level of the test chip select signal TXCS. This changes the level of the output signal of the NAND circuit 33c in accordance with the chip select signal XCS. When the chip select signal XCS is high, the NAND circuit 33b outputs a low signal. When the chip select signal XCS goes low, the NAND circuit 33b outputs a high signal, and the NAND circuit 33c outputs a low signal.

The output signal of the NAND circuit 33c is provided to the latch circuit 36a via the transmission gate 35a when the internal clock signal clkz goes low and activates the transmission gate 35a. Then, when the internal clock signal clkz goes high and activates the transmission gate 35b, the output signal of the latch circuit 36a is provided to the latch circuit 36b. The output signal of the latch circuit 36b is inverted by the inverter circuit 34b and output as the internal chip select signal csz.

When the internal clock signal clkz goes high, the command buffer 22 outputs the internal chip select signal csz in accordance with the test chip select signal TXCS during testing, and outputs the internal chip select signal csz in accordance with the chip select signal XCS during normal operation. Although not shown in the drawings, the other signals rasz, casz, and wez are output from the command buffer 22 through circuits having similar configurations.

Referring to FIG. 4, during normal operation, when the test mode signal TTST is low, the address buffer 23 receives ten address signal bits A0-A9 from an external device in response to the clock signal CLK and provides the address signal A0-A9 to the row address decoder 26 and the column address decoder 27.

During testing, when the test mode signal TTST is high, the address buffer 23 receives a test address signal TA0-TA9 from the tester in response to the test clock signal TCLK and provides the test address signal TA0-TA9 to the row address decoder 26 and the column address decoder 27. The circuit configuration of the address buffer 23 is similar to that of the command buffer 22.

During normal operation, the I/O buffer 24 receives write data DI0-DI63 from an external device in response to the clock signal CLK and provides the write data DI0-DI63 to the I/O controller 28. In response to the clock signal CLK, the I/O buffer 24 also receives read data DO0-DO63 from the I/O controller 28 and provides the read data DO0-DO63 to an external device.

During testing, the I/O buffer 24 receives test write data TI from the tester in response to the test clock signal TCLK and provides the test write data TI to the I/O controller 28. In response to the test clock signal TCLK, the I/O buffer 24 also receives test read data TQ0-TQ3 from the I/O controller 28 and provides the test read data TQ0-TQ3 to the tester.

In response to the chip select signal csz, the row address strobe signal rasz, the column address strobe signal casz, and the write enable signal wez, the command decoder 25 sets various command modes, such as an active mode, a precharge mode, a write mode, and a read mode, and provides respective mode signals ACT, PRE, WRT, and RED to the DRAM core 29.

Figure 7:
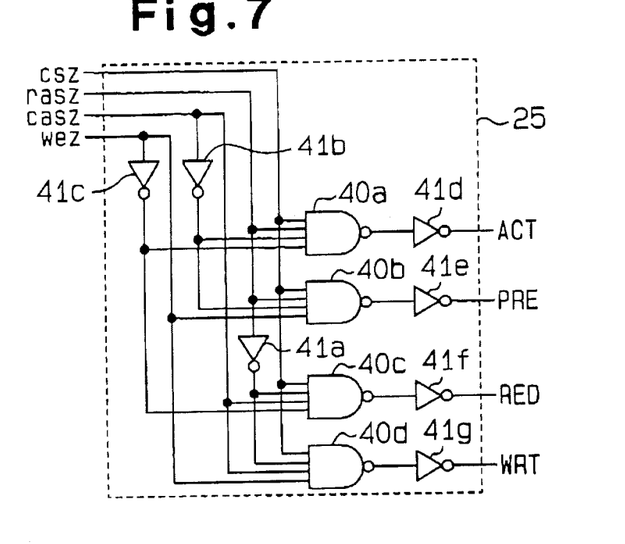
FIG. 7 is a schematic circuit diagram showing a command decoder of the DRAM of FIG. 4.

FIG. 7 is a schematic circuit diagram showing the command decoder 25. The command decoder 25 has four 4-input NAND circuits 40a, 40b, 40c, 40d and seven inverter circuits 41a, 41b, 41c, 41d, 41e, 41f, 41g.

The NAND circuits 40a, 40b, 40c, 40d each have a first input terminal provided directly with the chip select signal csz. The NAND circuits 40a, 40b each have second input terminals provided directly with the row address strobe signal rasz, and the NAND circuits 40c, 40d each have second input terminals provided with the row address strobe signal rasz via the inverter circuit 41a. The NAND circuits 40a, 40b each have third input terminals provided with the column address strobe signal casz via the inverter circuit 41b, and the NAND circuits 40c, 40d each have third input terminals provided directly with the column address strobe signal casz. The NAND circuits 40a, 40c each have fourth input terminals provided with the write enable signal wez via the inverter circuit 41c, and the NAND circuits 40b, 40d each have fourth input terminals provided directly with the write enable signal wez.

The output terminal of the NAND circuit 40a is connected to the inverter circuit 41d, which outputs the mode signal ACT. The output terminal of the NAND circuit 40b is connected to the inverter circuit 41e, which outputs the mode signal PRE. The output terminal of the NAND circuit 40c is connected to the inverter circuit 41f, which outputs the mode signal RED. The output terminal of the NAND circuit 40d is connected to the inverter circuit 41g, which outputs the mode signal WRT.

When the input signals csz, rasz are high and the input signals casz, wez are low, the NAND circuit 40a outputs a low signal and the mode signal ACT output by the inverter circuit 41d is high. In this state, if the level of any one of the input signals changes, the NAND circuit 40a outputs a high signal, and the mode signal ACT output by the inverter circuit 41c goes low. When the input signals csz, rasz, and wez are high and the input signal casz is low, the mode signal PRE is high. In this state, if the level of any one of the input signals chances, the mode signal PRE goes low. Further, when the input signals csz, casz are high and the input signals rasz, wez are low, the mode signal RED is high. In this state, if the level of any one of the input signals changes, the mode signal RED goes low. Further, when the input signals csz, casz, wez are high and the input signal rasz is low, the mode signal WRT is high. In this state, if the level of any one of the input signals changes, the mode signal WRT goes low.

Referring again to FIG. 4, during normal operation, the row address decoder 26 provides a word selection signal RA to the DRAM core 29 in response to a signal based on the address signals A0-A9 from the address buffer 23. During testing, the row address decoder 26 provides the word selection signal RA to the DRAM core 29 in response to a signal based on the test address signals TA0-TA9 from the address buffer 23.

During normal operation, the column address decoder 27 provides a column selection signal CA to the DRAM core 29 in response to a signal based on the address signals A0-A9 from the address buffer 23. During testing, the column address decoder 27 provides the column selection signal CA to the DRAM core 29 in response to a signal based on the test address signals TA0-TA9 from the address buffer 23.

During normal operation, the I/O controller 28 receives the write data DI0-DI63 from the I/O buffer 24 and provides the write data DI0-DI63 to the DRAM core 29. During testing, the I/0 controller 28 receives the test write data TI from the I/0 buffer 24 and provides the test write data TI to the DRAM core 29. The I/O controller 28 also provides the read data DO0-DO63 or the test read data TQ0-TQ3 from the DRAM core 29 to the I/O buffer 24.

During the read mode or the test read mode, the DRAM core 29 reads the read data DO0-DO63 or the test read data TQ0-TQ3 from the cell selected in accordance with the word selection signal RA and the column selection signal CA. The DRAM core 29 then provides the read data DO0-DO63 or the test read data TQ0-TQ3 to the I/O controller 28. Further, during the write mode or the test write mode, the DRAM core 29 writes the write data DI0-DI63 or the test write data TI to the cell selected in accordance with the word selection signal RA and the column selection signal CA.

Figure 8:
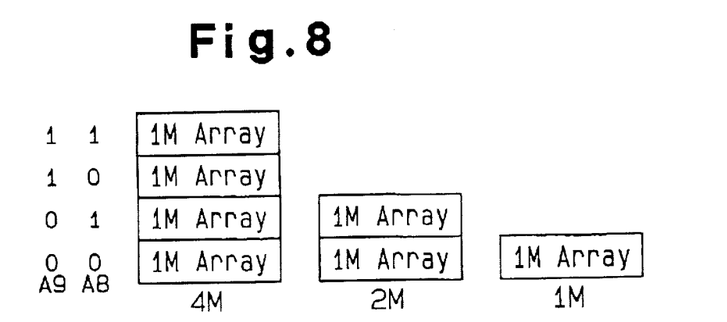
FIG. 8 is a diagram showing how a DRAM memory array is selected in accordance with the present invention.

With reference to FIG. 8, in the present embodiment, a DRAM macro includes, for example, separate activating arrays, each having one megabit, and addresses for selecting the activating arrays.

In the example shown in FIG. 8, the uppermost order bits of the address, A8 and A9, serve as an activating address.

The one megabit DRAM macros 11, 12 are active, for example, when (A9, A8) is (0,0).

The two megabit DRAM macro 13 is active, for example, when (A9, A8) is (0, 0) and (0, 1).

The four megabit DRAM macro 14 is active, for example, when (A9, A8) is (0, 0), (0, 1), (1, 0), and (1, 1).

With reference to FIG. 3, in the semiconductor device 200, test address signal lines are connected to each of the DRAMs 11, 12, 13, 14 so that the DRAMs 11-14 each independently receive the address signals TA0-TA9. By providing address signals in this manner, the activated array is selected freely. This enables the semiconductor device 200 to be tested in the manner shown in FIG. 9.

Figure 9:
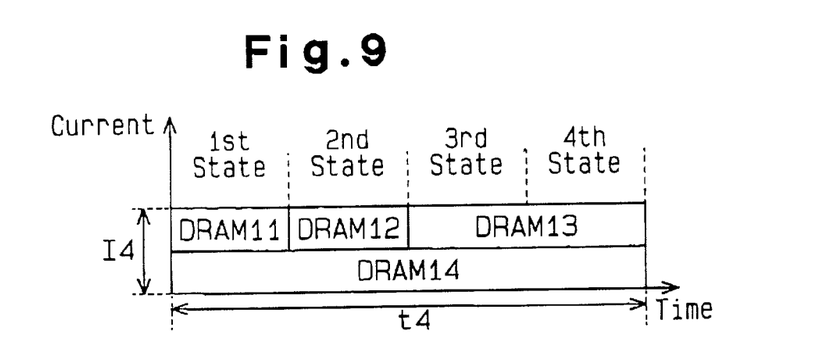
FIG. 9 is a graph showing the relationship between the testing order of DRAMs and the consumption current.

The semiconductor device 200 is tested in the four states shown in FIG. 9.

[First State]

The test address signal (TA9, TA8) of the first DRAM 11 is set at (0, 0), and the test address signal (TA9, TA8) of the fourth DRAM 14 is set at (0, 0). This allows for simultaneous testing of the first and fourth DRAM macros 11, 14. In this state, the test address signal (TA9, TA8) of the second DRAM 12 is set to one other than (0, 0), and the test address signal (TA9, TA8) of the third DRAM 13 is set to either (1, 0) or (1, 1). Accordingly, the second and third DRAM macros are not selected.

[Second State]

The test address signal (TA9, TA8) of the second DRAM 12 is set at (0, 0), and the test address signal (TA9, TA9) of the fourth DRAM 14 is set at (0, 1). This allows for simultaneous testing of the second and fourth DRAM macros. In this state, the test address signal (TA9, TA8) of the first DRAM 11 is set to one other than (0, 0), and the test address signal (TA9, TA8) of the third DRAM 13 is set to either (1, 0) or (1, 1). Accordingly, the first and third DRAM macros are not selected.

[Third State]

The test address signal (TA9, TA8) of the third DRAM 13 is set at (0, 0), and the test address signal (TA9, TA8) of the fourth DRAM 14 is set at (1, 0). This allows for simultaneous testing of the third and fourth DRAM macros. In this state, the test address signal (TA9, TA8) of the first DRAM 11 is set to one other than (0, 0), and the test address signal (TA9, TA8) of the second DRAM 12 is also set to one other than (0, 0). Accordingly, the first and second DRAM macros are not selected.

[Fourth State]

The test address signal (TA9, TA8) of the third DRAM 13 is set at (0, 1), and the test address signal (TA9, TA8) of the fourth DRAM 14 is set at (1, 1) This allows for simultaneous testing of the third and fourth DRAM macros. In this state, the test address signal (TA9, TA8) of the first DRAM 11 is set to one other than (0, 0), and the test address signal (TA9, TA8) of the second DRAM 12 is also set to one other than (0, 0). Accordingly, the first and second DRAM macros are not selected.

In this manner, the number of the simultaneously active DRAM macros in the semiconductor device 200 is restricted, the DRAM macros are selected chronologically, and testing is performed consecutively. In other words, the first to third DRAMs 11, 12, 13, each of which testing time is relatively short, are tested in a serial manner. The fourth DRAM 14, the testing time of which is longer that the first to third DRAMs 11, 12, 13, is tested in parallel with the testing of the first to third DRAMs 11, 12, 13. Thus, the consumption current is maintained at I4 during the test period t4, as shown in FIG. 9. In comparison to the consumption current I1 during the first test period t1 in the prior art semiconductor device 100, the consumption current I4 is about 1/2. Since the current consumed by the semiconductor device 200 is small during testing, the current that must be supplied by the tester is low. The test period t4 is the same as the prior art test period (t1+t2+t3).

The semiconductor device 200 of the present embodiment has the advantages described below.

(1) The DRAMs 11, 12, 13, 14 are each connected to independent test address signal lines, and the DRAMs 11, 12, 13 are selectively activated together with the DRAM 14, which requires the longest test period. Accordingly, the number of DRAM macros tested simultaneously is restricted, and the current consumption of the semiconductor device 200 is decreased. More specifically, the first to third DRAMs 11, 12, 13, each of which testing time is relatively short, are tested in a serial manner, and the fourth DRAM 14, the testing time of which is longer that the first to third DRAMs 11, 12, 13, is tested in parallel with the testing of the first to third DRAMs 11, 12, 13. As a result, the current consumption of the semiconductor device 200 is decreased. This decreases the current that must be supplied by the tester. Thus, the number of semiconductor devices 200 that can be tested simultaneously is increased.

(2) By testing the first to third DRAMs 11, 12, 13 consecutively in parallel with the testing of the fourth DRAM 14, lengthening of the test period t4 is prevented.

(3) The number of semiconductor devices 200 that can be tested simultaneously may be increased without lengthening the test period t4. This reduces the cost for testing the semiconductor device 200.

It should be apparent to those skilled in the art that the present invention may be embodied in many other specific forms without departing from the spirit or scope of the invention. Particularly, it should be understood that the present invention may be embodied in the following forms.

Figure 10:
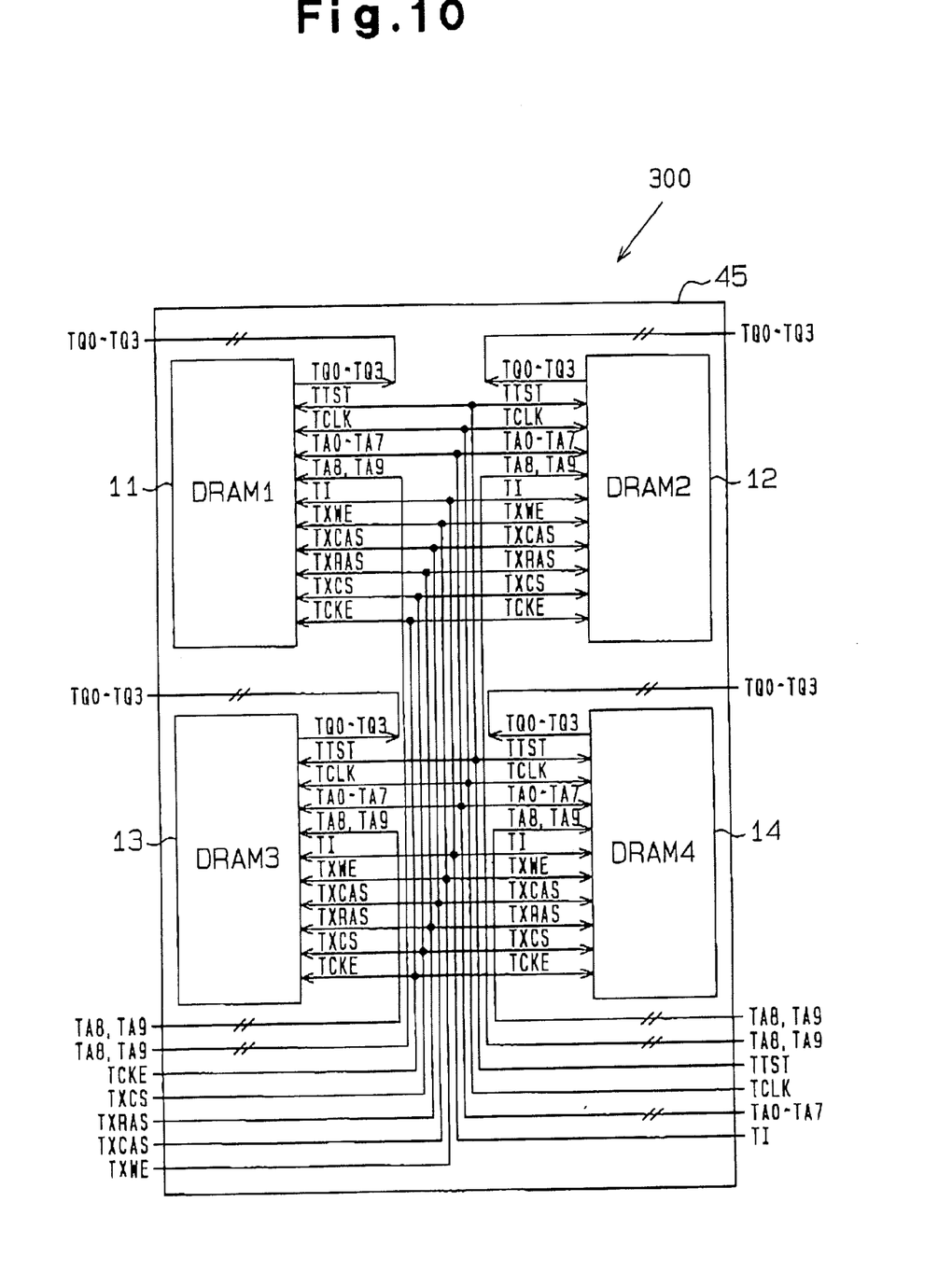
FIG. 10 is a schematic block diagram showing a semiconductor device according to a further embodiment of the present invention.

Referring to FIG. 10, in a semiconductor device 300, the DRAMs 11, 12, 13, 14 may each be independently connected with only the address signal lines that provide the test address signals TB8, TA9. In this case, common address signal lines are connected to the memory devices to provide the address signals TA0-TA7. This prevents an increase in the number of test terminals in the semiconductor device 300, while enabling the test methodology previously discussed and illustrated in FIG. 9. This increases the number of the semiconductor device 300 that may be tested simultaneously without increasing the current supplying capability of the tester as compared to the prior art.

Figure 11:
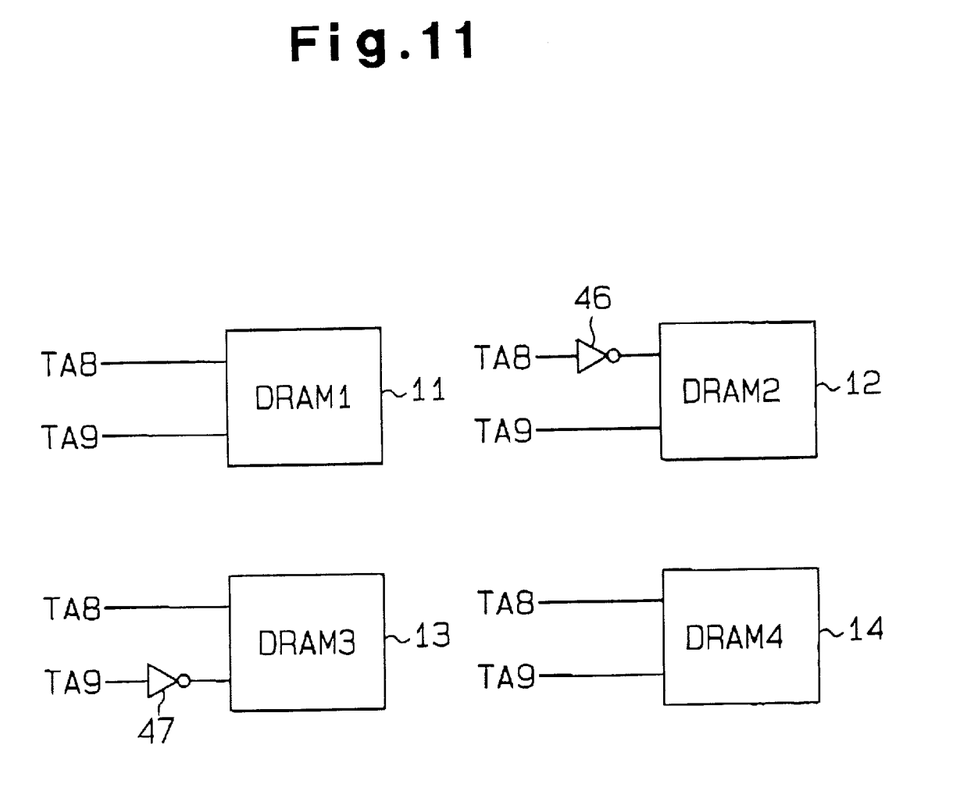
FIG. 11 is a block diagram showing part of the semiconductor device of FIG. 10.

Common test address signal lines may be used as shown in FIG. 11. In this case, a signal line of the test address signal TA8 for the second DRAM 12 is provided with an inverter circuit 46 located near the DRAM 12, and a signal line of the test address signal TA9 for the third DRAM 13 is provided with an inverter circuit 47 located near the DRAM 13.

For example, the first and fourth DRAMs 11, 14 are active when the test address signal (TA9, TA8) provided by the tester is (0, 0), and the second and fourth DRAMs 12, 14 are active when the test address signal (TA9, TA8) is (0, 1). Further, the third and fourth DRAMs 13, 14 are active when the test address signal (TA9, TA8) is (1, 0), and the third and fourth DRAMs 13, 14 are active when the test address signal (TA9, TA8) is (1, 1). In other words, selection of the DRAM macros is enabled simply by increasing the address signal (TA9, TA8) of the tester in an incremental manner from (0, 0) to (0, 1) to (1, 0) and then to (1, 1). This allows for an increased number of semiconductor devices that can be tested simultaneously without increasing the number of test terminals.

The DRAMs 11, 12, 13, 14 may be tested selectively, for example, by providing the test chip select signals to the DRAMs 11, 12, 13, 14 independently. In this case, the DRAM macros are tested selectively in accordance with the test chip select signal of each of the DRAMs 11, 12, 13, 14.

The number of the memory devices connected to the semiconductor devices 200, 300 is not restricted and may be, for example, five or six. The present invention is effective when at least one memory device among three has a memory capacity differing from the others.

The present invention may be applied to a semiconductor device to which a static random access memory (SRAM) or a flash memory is connected.

The present examples and embodiments are to be considered as illustrative and not restrictive, and the invention is not to be limited to the details given herein, but may be modified within the scope and equivalence of the appended claims.

What is claimed is:

1. A semiconductor device comprising:

at least three independently accessible memory devices that can be independently tested, at least one of the memory devices having a memory capacity differing from the other memory devices; and selection signal lines for independently providing each of the memory devices with a selection signal that activates the memory device, the selection signal being provided to at least two of the memory devices, excluding one of the memory devices having a test period that is the longest test period among the memory devices, to serially test the at least two of the memory devices, and the selection signal being provided to the memory device having the longest test period to test the memory device having the longest test period in parallel with the at least two of the memory devices being serially tested.

2. The semiconductor device according to claim 1 wherein the selection signal lines are each provided in correspondence with each of the memory devices.

3. The semiconductor device according to claim 2, wherein the selection signal lines are included in a plurality of address signal lines.

4. The semiconductor device according to claim 2, wherein the selection signal lines are provided separately from the address signal lines.

\* \* \* \* \*